US008295508B2

(12) United States Patent
Vernon et al.

(10) Patent No.: US 8,295,508 B2
(45) Date of Patent: Oct. 23, 2012

(54) PROCESSING AN AUDIO SIGNAL

(75) Inventors: Christopher David Vernon, Beverly (GB); Richard Edward Webster, Sheffield (GB)

(73) Assignee: Sontia Logic Limited, Sheffield (GB)

( * ) Notice: Subject to any disclaimer, the term of this patent is extended or adjusted under 35 U.S.C. 154(b) by 233 days.

(21) Appl. No.: 12/761,062

(22) Filed: Apr. 15, 2010

(65) Prior Publication Data

US 2010/0266141 A1 Oct. 21, 2010

(30) Foreign Application Priority Data

Apr. 17, 2009 (GB) .................................. 0906594.7

(51) Int. Cl.

| | |
|---|---|
| ***H03G 5/00*** | (2006.01) |
| ***H03G 3/00*** | (2006.01) |
| ***H04R 1/40*** | (2006.01) |

(52) U.S. Cl. ............................... 381/98; 381/61; 381/97

(58) Field of Classification Search .................... 381/61, 381/98, 17–19, 101, 103
See application file for complete search history.

(56) References Cited

U.S. PATENT DOCUMENTS

| | | | | |
|---|---|---|---|---|
| 5,263,019 | A | 11/1993 | Chu | |
| 6,606,388 | B1 | 8/2003 | Townsend et al. | |
| 2003/0044023 | A1 * | 3/2003 | Larsen | 381/61 |
| 2004/0071297 | A1 | 4/2004 | Katou et al. | |

FOREIGN PATENT DOCUMENTS

| | | | |
|---|---|---|---|
| GB | 2282692 | A | 4/1995 |
| GB | 2415116 | A | 12/2005 |
| GB | 2443291 | A | 4/2008 |
| WO | 98/46044 | A1 | 10/1998 |
| WO | 99/26454 | A1 | 5/1999 |
| WO | 00/14998 | A1 | 3/2000 |
| WO | 02/074013 | A2 | 9/2002 |

* cited by examiner

*Primary Examiner* — Yuwen Pan
*Assistant Examiner* — George Monikang
(74) *Attorney, Agent, or Firm* — Richard M. Goldberg

(57) ABSTRACT

A method and apparatus for processing an audio signal to enhance the perceived lower frequency content of the audio signal when played through an audio output device, includes an input configured to receive an audio input signal, a processor configured to filter the audio input signal to produce a high frequency signal and a low frequency signal, generate an enhancement signal by producing higher frequency harmonics from the low frequency signal, including a process of self convolution, and combine the high frequency signal with the enhancement signal to produce an output signal; and an output configured to receive the output signal and produce an audio output.

15 Claims, 10 Drawing Sheets

SELF-CONVOLUTION =

$$\sum_{i=0}^{N-1} A[i] \times A[N-1-i] \times W[i]$$

*Fig. 6*

$$F2 = (A \times H \times W1) + (B \times G \times W2) + (C \times F \times W3) + (D \times E \times W4) + (E \times D \times W5) + (F \times C \times W6) + (G \times B \times W7) + (H \times A \times W8)$$

*Fig. 7*

$$F4 = (W \times Z \times W9) + (X \times Y \times W10) + (Y \times X \times W11) + (Z \times W \times W12)$$

*Fig. 8*

RING MODULATION

F13 = F1 × F2
F35 = F1 × F4
F26 = F2 × F4

*Fig. 9*

ENHANCEMENT SIGNAL =

$$(H2 \times F2) + (H4 \times F4) + (H13 \times F13) + (H35 \times F35) + (H26 \times F26)$$

*Fig. 10*

PROCESSING AN AUDIO SIGNAL

CROSS REFERENCE TO RELATED APPLICATIONS

This application claims priority from United Kingdom Patent Application No. 09 06 594.7, filed 17 Apr. 2009, the whole contents of which are incorporated herein by reference in their entirety.

BACKGROUND OF THE INVENTION

1. Field of the Invention

The present invention relates to processing an audio signal in order to enhance the sound output.

2. Description of the Related Art

In loudspeaker designs, the ability of the woofer to produce low frequencies is dictated by its size and power. With the increasing drive towards Small speaker designs, the bass cut-off frequency of such loudspeaker systems becomes higher. The missing fundamental effect is known. The brain perceives the pitch of a tone by the ratio of higher harmonics related to a fundamental, and not just by the fundamental itself. Thus, if the ear detects a series of harmonic frequencies not containing the fundamental frequency itself, the brain will still perceive the fundamental frequency to be present. Generating higher harmonics above the bass cut-off frequency of a loudspeaker when polyphonic sound is being played is difficult. A technique is therefore required to pitch shift the audio by one octave, thereby producing a first harmonic, and then produce additional higher-order harmonics.

BRIEF SUMMARY OF THE INVENTION

According to an aspect of the present invention, there is provided a method of processing an audio signal to enhance the perceived low frequency content of the audio signal when played through an audio output s device. The method comprises the steps of: receiving an audio input signal;

filtering the audio input signal to produce a high frequency signal and a low frequency signal; generating an enhancement signal by producing higher frequency harmonics from the low frequency signal; and combining the high frequency signal with the enhancement signal to produce an output signal.

BRIEF DESCRIPTION OF THE SEVERAL VIEWS OF THE DRAWINGS

FIG. 6 illustrates the method of self convolution;

FIG. 7 shows a worked example of self convolution of F1;

FIG. 8 shows self convolution of F2;

FIG. 9 shows ring modulation; and

FIG. 10 shows production of the enhancement signal.

DETAILED DESCRIPTION OF THE PREFERRED EMBODIMENTS

FIG. 1

Figure 1:
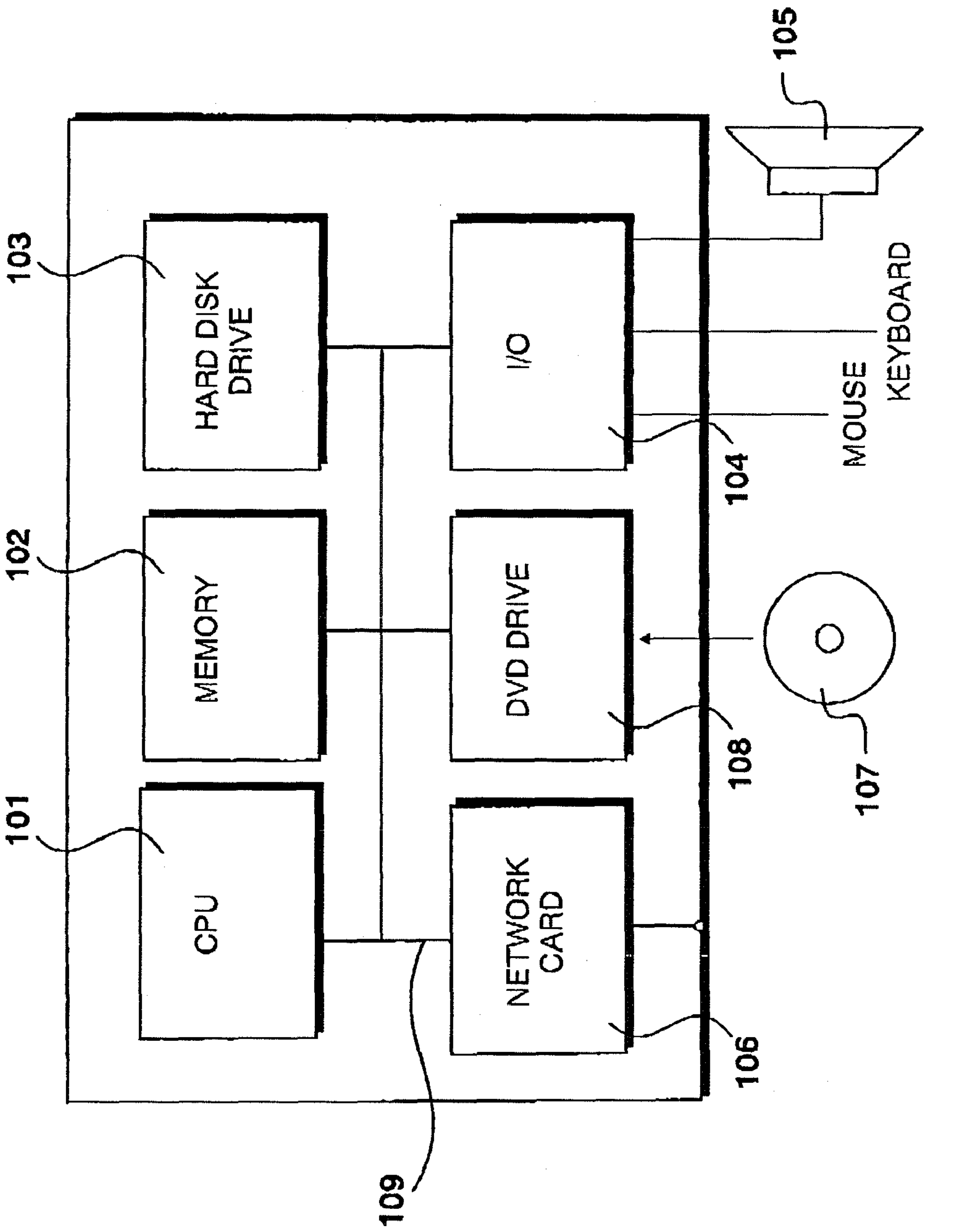
FIG. 1 shows an example of components contained within an audio processing system in accordance with an embodiment of the present invention.

An example of components contained within an audio processing system in accordance with an embodiment of the present invention is shown in FIG. 1. A central processing unit 101 is provided, as well as a random access memory 102, the latter being provided for the storage of programs and operation data executed by the central processing unit 101.

Storage for programs and operational data is also provided by a hard disk drive 103, although alternative forms of storage are possible, such as solid-state flash memory. An input/output interface 104 is provided for receiving input commands from, for example a mouse, keyboard or other input device, and for providing output to output devices, which may be audio output devices such as loudspeaker 105, headphones or other types of output device. A network card 106 provides a facility to communicate over a network and new programs and data may be loaded across such a network, or indeed from portable storage devices, such as disc 107, by a DVD drive 108. The components communicate via a system bus 109.

FIG. 2

Figure 2:
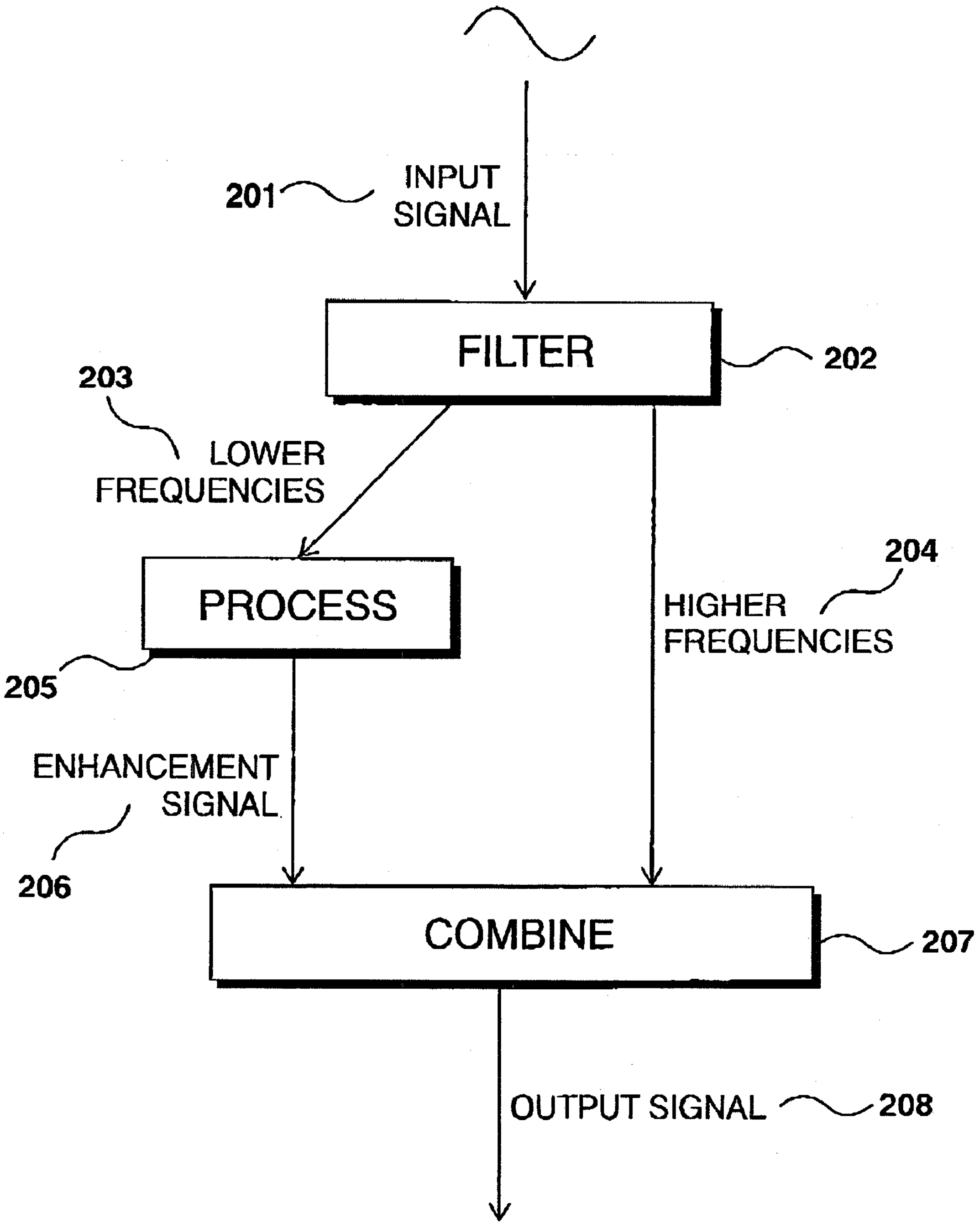
FIG. 2 shows an overview of processes according to an embodiment of the present invention.

An overview of processes according to an embodiment of the present invention is shown in FIG. 2. In order to enhance the sound output, a series of processes are carried out on the input signal.

An audio input signal is received at 201, and a filter is applied at 202. In an embodiment of the invention, the audio input signal is represented as digital samples, and thus the filtering step is performed in the digital domain.

In a preferred embodiment a single filter may be used, such as a high pass filter. When being deployed for enhancing the characteristics of a loudspeaker, the response of the high pass filter is preferably matched to the low frequency performance of the loudspeaker. The filtered signal may be subtracted from a copy of the original signal to produce a second signal that has only the low frequencies present. In an alternative embodiment, two separate filters may be used, one being a low pass filter and the second being a high pass filter. This alternative embodiment could be implemented using notch filters and/or a band pass filter. The filtering process at 202 separates the low frequencies shown at 203 from the high frequencies shown at 204. The low frequencies are then processed at 205 as is further described with reference to FIG. 3.

A result of the above described processing is the production of an enhancement signal shown at 206. This enhancement signal has been produced from the low frequencies, but is itself at a higher frequency. The enhancement signal 206 is then combined with the high frequencies 204 at 207. Thus, the resulting output signal at 208 is produced with relatively high frequency content. However, due to processing that took place at 205, the output signal sounds similar to the input signal due to psychoacoustic effects.

In particular, low frequencies contained in the input signal appear to the ear to still be present in the output signal.

The processing undertaken is performed by windowing (by using a function such as a Hann function) of an incoming audio sample, and convolving the windowed sample with the original audio sample. This can be seen as self-convolution. This process is further described with reference to FIG. 3. Thus, in the time/frequency-domain, the audio progresses sample by sample in one direction, whilst the impulse response is travelling in the opposite direction sample by sample. This results in a polyphonic linear pitch shift of a perfect octave.

Digital techniques generally produce odd order harmonics with relative ease, these being the type of harmonics that generally sound distorted and undesirable. The types of distortions that are considered desirable are generally even order harmonics, which are harder to produce digitally. The present invention provides a facility to produce the entire even order harmonic series by taking the second harmonic which has been generated by the above processing, and performing the processing again to produce a fourth, and so on. Further even order harmonics may be created in this way.

To achieve the missing fundamental effect, the method involves adding in the produced even order harmonic series with around 60% total harmonic distortion of a pure sine wave at certain prescribed amounts. The result is that without actually playing the fundamental lowest note, the ear will hear the total harmonic distortion and imagine the low note. This results in the perception of tones lower than are actually produced by an output device. Indeed, the ear will hear tones produced from a speaker that the speaker is in fact incapable of producing.

FIG. 3

Figure 3:
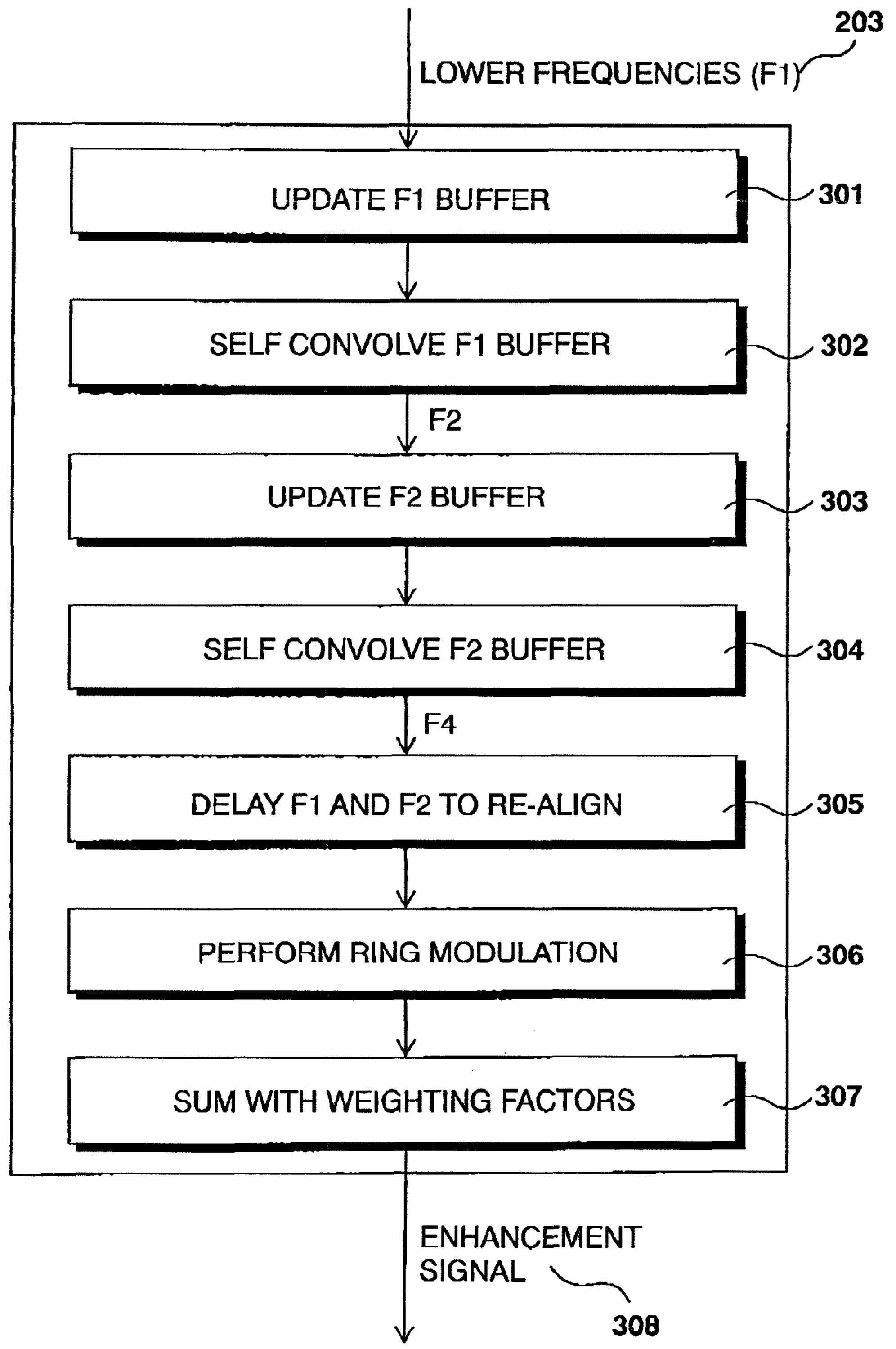
FIG. 3 shows an expansion of the processing at step 105.

An expansion of the processing at step 205 is shown in FIG. 3. The input of lower frequencies is as shown at 203. A series of buffers are provided with samples of windowed signal. At step 301 a first buffer, the F1 buffer (shown in FIG. 4) is updated.

The most recent sample is added to the buffer and the oldest sample previously stored in the buffer is discarded.

At step 302 the F1 buffer is convolved with itself. This is further described with reference to FIG. 7. As a result of this convolution a value F2 is produced. A further buffer (shown in FIG. 4) stores F2 values and this buffer is updated with the new value at step 303. The F2 buffer is self convolved at step 304 as described with reference to FIG. 8. The result of this convolution is the value F4.

F1 is the first harmonic, F2 is the second harmonic and F4 is the fourth harmonic. The self convolution process imposes a latency which is different for the F1, F2 and F4 values. The F1 and F2 samples are thus delayed at step 305 so that the F1, F2 and F4 values are realigned in time.

A process of ring modulation is then carried out at step 306, as further described with reference to FIG. 9. This creates further harmonics.

The harmonics which have been produced are then summed with weighting factors at step 307. This is further described with reference to FIG. 10. The result of this sum is an enhancement signal 308.

FIG. 4

Figure 4:
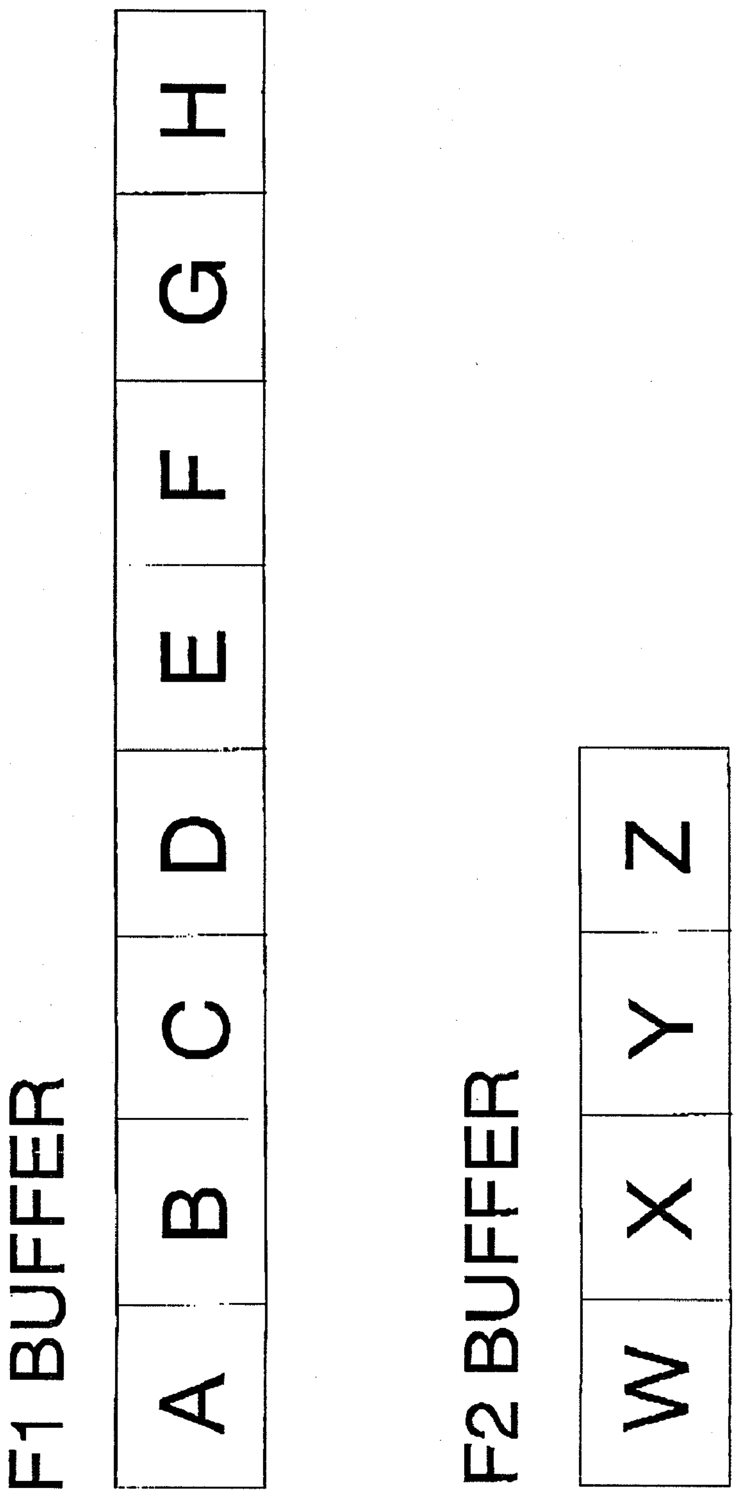
FIG. 4 shows the F1 and F2 buffers.

The F1 buffer and the F2 buffer are shown in FIG. 4. The F1 buffer stores a series of samples of the incoming lower frequencies (F1). The buffers are, in this example, of fixed length. In this case there are spaces for eight samples in the F1 buffer. A value N is used to represent the number of spaces in a buffer so in this example N=8 and the eight spaces in the buffer are represented by A, B, C, D, E, F, G and H.

The F2 buffer is also shown in FIG. 4. In this example the F2 buffer stores the previous N/2 (N divided by 2) samples of the F2 signal. So in this example as the F1 buffer stores 8 values the F2 buffer stores 4 values.

FIG. 5

Figure 5:
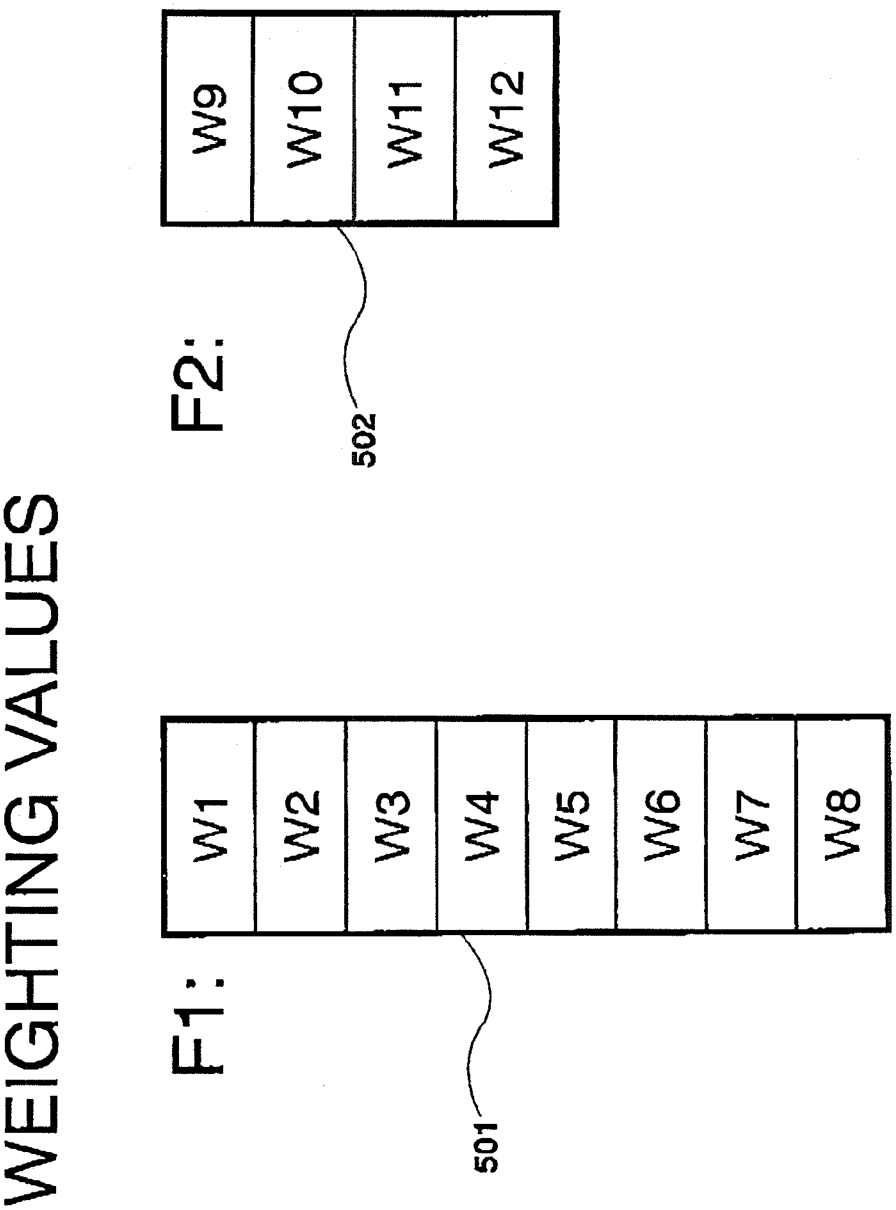
FIG. 5 shows examples of weighting values.

Examples of arrays of weighting values are shown in FIG. 5. At 501 a first array is shown which relates to the F1 harmonic and provides a series of eight weighting values which correspond with the eight samples which are stored in the H buffer.

At 502 a second weighting array is shown which corresponds with the F2 harmonic and are used in order to self convolve the F2 harmonic to produce the F4 harmonic.

FIG. 6

The method of self convolution is illustrated in a general form in FIG. 6. For a block of size N contained in an array A[N], a set of window weight values contained in an array W[N] and an array index i with values from zero to N−1, the self convolution is as shown in FIG. 6.

FIG. 7

A worked example of self convolution of F1 (used to produce an F2 value) is shown in FIG. 7. The first value A from the F1 buffer is convolved with the last value H from the F1 buffer which is convolved with the first value W1 from the F1 weighting array. This is added to the result of the convolution of B with G and the second value W2 from the F1 weighting array, etc in accordance with the formula shown in FIG. 7. Thus the buffer is convolved with a windowed version of itself to produce a single sample of the second harmonic signal F2. This F2 value produced is used to update another buffer as shown in FIG. 8.

FIG. 8

The F2 buffer is convolved with a windowed version of itself to produce a fourth harmonic F4 as illustrated in FIG. 8.

The self convolution process imposes a latency which is different for the F1, F2 and F4 values. Therefore the F1 and F2 samples are delayed so that the F1 , F2 and F4 values are realigned in time. Afterwards ring modulation is used to create further harmonics. This is further illustrated in FIG. 9.

FIG. 9

FIG. 9 shows ring modulation in order to create harmonics F13, F35 and F26. Each of these is created by convolution of previously created harmonics. Ring modulation of two signals containing frequencies A and B produces a signal with frequencies A plus B and A minus B.

FIG. 10

To produce the enhancement signal containing the harmonic series the separate harmonics are summed with weighting factors (represented here as W2, W4, W13, W35 and W26). The weighting values are used to control the relative contribution of each harmonic to the series. The enhancement signal is produced by the convolution of each weighting factor with its harmonic value as illustrated in FIG. 10.

The result of this processing is a signal having a realistic sounding and stable pitch shift of one octave. The self convolution technique is polyphonic, and so the pitch shift can be achieved completely in phase at all frequencies.

The enhancement signal produced as previously described is combined with the higher frequencies from the input signal in order to produce the final output signal. In an embodiment of the invention, the output signal is converted to an analog signal and thereafter amplified and supplied to an audio output device such as a loudspeaker.

The result of this processing is that the resulting output signal is perceived to include harmonics which are not actually part of the signal. This means that sounds are perceived which may not be within the production capability of the audio output device. For example, a small speaker which is incapable of reproducing low frequencies will apparently generate lower frequencies than it is physically capable of producing because the ear perceives fundamentals which are not present.

What is claimed is:

1. A method of processing an audio signal to enhance the perceived low frequency content of said audio signal when played through an audio output device, comprising the steps of: receiving an audio input signal; filtering said audio input signal to produce a high frequency signal and a low frequency signal; generating an enhancement signal by producing higher frequency harmonics from said low frequency signal, including a process of self convolution, wherein said self convolution includes a series of samples of said low frequency signal being windowed, and then convolved with the original samples of said low frequency signal; and combining said high frequency signal with said enhancement signal to produce an output signal.

2. The method of claim 1, wherein said audio input signal is represented as digital samples and said filtering step is performed in the digital domain.

3. The method of claim 1, wherein a first filtering step is performed upon said input signal to produce said high frequency signal and a second filtering step is performed to produce said low frequency signal.

4. The method of claim 1, wherein said generating step further includes a process of ring modulation.

5. The method of claim 1, wherein said generating step further includes a process of combining a plurality of harmonics with weighting factors.

6. The method of claim 1, wherein said output signal is converted to an analog signal, amplified and supplied to a loudspeaker that is not capable of reproducing components of said low frequency signal.

7. Apparatus for processing an audio signal, comprising: an input configured to receive an audio input signal; a processor configured to: filter said audio input signal to produce a high frequency signal and a low frequency signal; generate an enhancement signal by producing higher frequency harmonics from said low frequency signal, including a process of self convolution, wherein said self convolution includes a series of samples of said low frequency signal being windowed, and then convolved with the original samples of said low frequency signal; and combine said high frequency signal with said enhancement signal to produce an output signal; and an output configured to receive said output signal and produce an audio output.

8. Apparatus according to claim 7, wherein said output is a loudspeaker.

9. Apparatus according to claim 8, wherein said loudspeaker is not capable of reproducing components of said low frequency signal.

10. Apparatus according to claim 7, wherein said processor is further configured to perform a process of ring modulation when generating said enhancement signal.

11. Apparatus according to claim 7, wherein said processor is further configured to combine a plurality of harmonics with weighting factors when generating said enhancement signal.

12. A non-transitory computer-readable medium having computer-readable instructions executed by a computer that when executed by the computer, cause the computer to perform the steps of: receiving an audio input signal; filtering said audio input signal to produce a high frequency signal and a low frequency signal; generating an enhancement signal by producing higher frequency harmonics from said low frequency signal, including a process of self convolution, wherein said self convolution includes a series of samples of said low frequency signal being windowed, and then convolved with the original samples of said low frequency signal; and combining said high frequency signal with said enhancement signal to produce an output signal.

13. The non-transitory computer-readable medium according to claim 12, having further computer-readable instructions executable by the computer that, when executed by the computer, cause the computer to perform the additional steps of:

performing a first filtering step upon said input signal to produce said high frequency signal; and performing a second filtering step upon said input signal to produce said low frequency signal.

14. The non-transitory computer-readable medium according to claim 12, having further computer-readable instructions executable by the computer that, when executed by the computer, cause the computer to perform an additional process of ring modulation during said generating step.

15. The non-transitory computer-readable medium according to claim 12, having further computer-readable instructions executable by the computer that, when executed by the computer, cause the computer to perform an additional process of combining a plurality of harmonics with weighting factors during said generating step.

* * * * *